(12) United States Patent
Maxwell

(10) Patent No.: US 8,883,603 B1
(45) Date of Patent: Nov. 11, 2014

(54) SILVER DEPOSITION METHOD FOR A NON-VOLATILE MEMORY DEVICE

(75) Inventor: Steven Patrick Maxwell, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/564,639

(22) Filed: Aug. 1, 2012

(51) Int. Cl.
*H01L 21/02* (2006.01)

(52) U.S. Cl.
USPC .................................. 438/382; 257/E21.003

(58) Field of Classification Search
USPC .............................. 438/382, 21, 50, 238, 330
See application file for complete search history.

(56) References Cited

U.S. PATENT DOCUMENTS

| | | | |
|---|---|---|---|
| 5,707,487 A * | 1/1998 | Hori et al. ................ | 438/703 |
| 7,023,093 B2 | 4/2006 | Canaperi et al. | |
| 7,786,589 B2 | 8/2010 | Matsunaga et al. | |
| 7,858,468 B2 * | 12/2010 | Liu et al. ................ | 438/237 |
| 8,088,688 B1 | 1/2012 | Herner | |
| 8,389,971 B2 | 3/2013 | Chen et al. | |
| 8,399,307 B2 | 3/2013 | Herner | |
| 2003/0052330 A1* | 3/2003 | Klein ........................ | 257/154 |
| 2004/0192006 A1* | 9/2004 | Campbell et al. ........ | 438/382 |
| 2004/0194340 A1 | 10/2004 | Kobayashi | |
| 2010/0102290 A1 | 4/2010 | Lu et al. | |
| 2011/0312151 A1 | 12/2011 | Herner | |
| 2012/0001145 A1* | 1/2012 | Magistretti et al. ...... | 257/4 |
| 2012/0012808 A1 | 1/2012 | Herner | |
| 2012/0074374 A1 | 3/2012 | Jo | |
| 2012/0074507 A1* | 3/2012 | Jo et al. .................... | 257/379 |
| 2012/0250183 A1* | 10/2012 | Tamaoka et al. .......... | 360/99.08 |
| 2012/0252183 A1* | 10/2012 | Herner ...................... | 438/382 |

OTHER PUBLICATIONS

Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012,
Notice of Allowance for U.S. Appl. No. 13/532,019 dated Nov. 14, 2012.
John S. Suehle et al., "Temperature Dependence of Soft Breakdown and Wear-Out in Sub-3 nm $SiO_2$ Films", IEEE Annual International Reliability Physics Symposium, 2000, pp. 33-34, San Jose, California.
Woonki Shin et al. "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036 dated Jul. 9, 2013.
Office Action for U.S. Appl. No. 13/764,698 dated Jul. 11, 2013.
Office Action for U.S. Appl. No. 13/481,600 dated Sep. 20, 2013.

* cited by examiner

*Primary Examiner* — Zandra Smith
*Assistant Examiner* — Damian A Hillman
(74) *Attorney, Agent, or Firm* — Ogawa P.C.

(57) ABSTRACT

A method for forming a silver structure for a non-volatile memory device includes providing a silver layer material upon a underlying substrate, forming a diffusion barrier material overlying the silver layer material, forming a dielectric hard mask material overlying the diffusion barrier material, subjecting the dielectric hard mask material to a patterning and etching process to form a hard mask and to expose a portion of the diffusion barrier material, subjecting the portion of the diffusion barrier material to an etching process using one or more chlorine bearing species as an etchant material, wherein one or more chloride contaminant species is formed overlying at least a portion of the silver layer material, and reacting the one or more chloride contaminant species with a solution comprising an ammonia species to form a water soluble species, wherein the ammonia species is free from an oxidizing species.

20 Claims, 5 Drawing Sheets

SILVER DEPOSITION METHOD FOR A NON-VOLATILE MEMORY DEVICE

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, a new semiconductor device structure and integration is desirable.

BRIEF SUMMARY OF THE PRESENT INVENTION

The present invention is generally related to resistive switching devices. More particularly, embodiments according to the present invention provide a cleaning method for a silver material for a resistive switching device. Embodiments according to the present invention can be applied to non-volatile memory devices but it should be recognized that the present invention can have a much broader range of applicability.

In a specific embodiment, a method for forming a silver structure for a non-volatile memory device is provided. The method includes providing a silver layer material having a surface region. A diffusion barrier material is formed overlying the silver layer material and a dielectric hard mask material is formed overlying the diffusion barrier material. The method includes subjecting the dielectric hard mask material to a first patterning and etching process to form a hard mask. The hard mask is configured to form one or more silver structures for a resistive switching device in a specific embodiment. The method subjects the diffusion barrier material to a second patterning and etching process using the hard mask as a masking layer. The second patterning and etching process uses one or more chlorine bearing species as an etchant material in a specific embodiment. The one or more chlorine bearing species form one or more chloride contaminant species derived from the chlorine bearing species and the silver layer material overlying at least the silver material layer. The method includes reacting the one or more chloride contaminant species with a solution comprising an ammonia species to form a water soluble species. The solution comprising the ammonia species is configured to be free from an oxidizing species in a specific embodiment.

According to one aspect of the invention, a method for forming a silver structure for a non-volatile memory device is disclosed. One process includes providing a silver layer material upon a underlying substrate, and forming a diffusion barrier material overlying the silver layer material. A technique includes forming a dielectric hard mask material overlying the diffusion barrier material, and subjecting the dielectric hard mask material to a patterning and etching process to form a hard mask and to expose a portion of the diffusion barrier material. A method includes subjecting the portion of the diffusion barrier material to an etching process using one or more chlorine bearing species as an etchant material, wherein one or more chloride contaminant species is formed overlying at least a portion of the silver layer material, and reacting the one or more chloride contaminant species with a solution comprising an ammonia species to form a water soluble species, wherein the ammonia species is free from an oxidizing species.

According to another aspect of the invention, a method of forming a non-volatile memory device is disclosed. One process includes providing a substrate having a surface region, forming a first dielectric material overlying the surface region, and forming a first wiring structure overlying the dielectric material. A technique includes forming a junction material overlying the first wiring structure, forming a resistive switching material comprising an amorphous silicon material overlying the junction material, and forming an active conductive material comprising a silver layer material overlying the resistive switching material. A method may include forming a diffusion barrier material overlying the active conductive material, forming a dielectric hard mask material overlying the diffusion barrier material, and subjecting the dielectric hard mask material to a patterning and etching process to form a patterned dielectric hard mask and to expose a portion of the diffusion barrier material. A procedure may include subjecting the portion of the diffusion barrier material to an etching process using one or more chlorine bearing species as an etchant material to form a patterned diffusion barrier layer and to form one or more chloride contaminant species overlying at least a portion of the silver layer material, dissolving the one or more chloride contaminant species with a solution comprising an ammonia species to expose a silver layer material surface region substantially free from the one or more chloride contaminant species, wherein the ammonia species is substantially free from an oxidizing species, and forming a second wiring structure overlying at least a portion of the silver layer material surface region substantially free from the one or more chloride contaminant species.

Many benefits can be achieved by ways of the present invention. For example, embodiments according to the present invention provide a method to remove contaminant species from a silver material surface while maintaining the silver material intact and free from defects. Additionally, the present method uses conventional semiconductor equipment and techniques without modification. Depending on the embodiment, one or more of these benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are directed to resistive switching devices. More particularly, embodiments according to the present invention provide methods to form a silver structure for the resistive switching device. The present method has been applied to fabrication of a non-volatile memory device but it should be recognized that embodiments according to the present invention can have a much broader range of applicability.

For resistive switching devices using amorphous silicon as a switching material, a metal material is used for at least one of the electrodes. The resistance of the amorphous silicon material is caused to change depending on one or more conductor particles derived from a conductor electrode upon application of a potential difference between the electrodes. Silver is a suitable conductor material in some embodiments as silver has a suitable diffusion characteristic in the amorphous intrinsic silicon material in the presence of the electric field. However, certain chlorine containing etchant materials during subsequent process steps can react with silver material to form contaminating conducting material. In some embodiments, the contaminants are detrimental to device yield and performance.

Accordingly, embodiments according to the present invention provide a cleaning method for the silver contaminating material that is compatible with the present device process flow.

Figure 1:
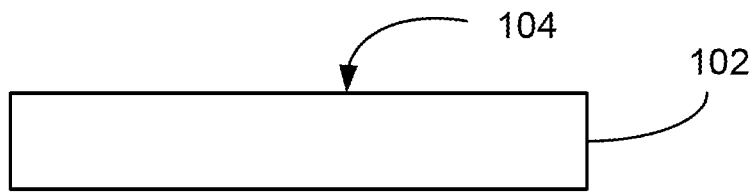
FIG. 1 is a simplified diagram illustrating a process step according to various embodiments of the present invention.

FIGS. 1-14 illustrate a method of forming a resistive switching device for a memory device according to various embodiments of the present invention. As shown in FIG. 1, a semiconductor substrate 102 having a surface region 104 is provided. Semiconductor substrate 102 can be a single crystal silicon wafer, a silicon germanium material, a silicon on insulator (commonly called SOI) depending on the embodiment. In certain embodiments, semiconductor substrate 202 can have one or more MOS devices formed thereon or therein. The one or more MOS devices can be controlling circuitry for the resistive switching device, or the like in some embodiments.

Figure 2:
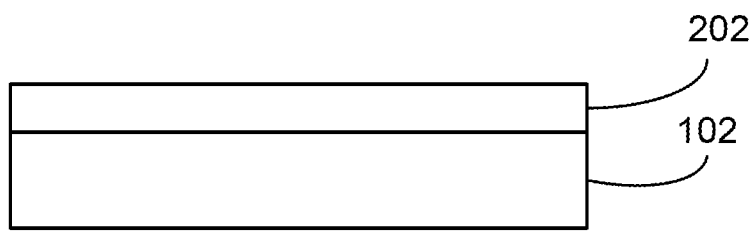
FIG. 2 is a simplified diagram illustrating a process step according to various embodiments of the present invention.

As illustrated in FIG. 2, embodiments of the method include depositing a first dielectric material 302 overlying the semiconductor substrate 102. First dielectric material 202 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 202 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 3:
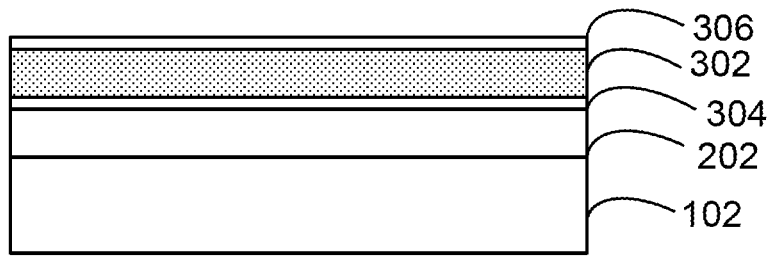
FIG. 3 is a simplified diagram illustrating a process step according to various embodiments of the present invention.

Referring to FIG. 3, embodiments of the method include depositing a first wiring material 302 overlying the first dielectric material. First wiring material 302 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 304 is first formed overlying the first dielectric material 202 before deposition of the first wiring material 302 to promote adhesion of the first wiring material 302 to the first dielectric material 202. A diffusion barrier material 306 may also be formed overlying the first wiring material 302 to prevent, for example, the conductive material, the metal material, oxygen, or the like to contaminate other portions of the device in a specific embodiment.

Figure 4:
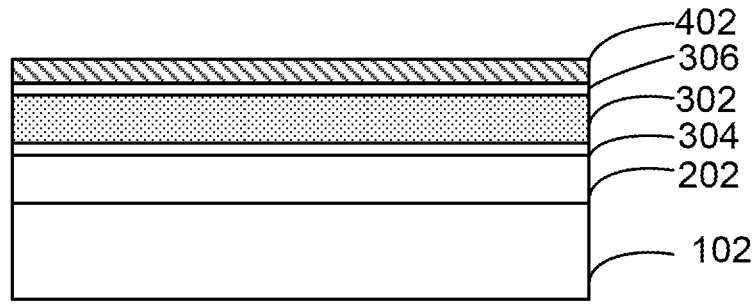
FIG. 4 is a simplified diagram illustrating a process step according to various embodiments of the present invention.

Referring to FIG. 4, the method includes forming a junction material 402 overlying at least the first wiring material 402 (or first diffusion barrier material 306, if used). First junction material 402 can be a p-doped silicon-bearing material (e.g. p++ polysilicon, p-doped silicon-germanium, or the like) in a specific embodiment. The p++ polysilicon material can be formed by using a deposition process such as a low pressure chemical vapor deposition process a plasma enhanced chemical vapor deposition process using silane (SiH$_4$) or disilane (Si$_2$H$_6$), or a suitable chlorosilane depending on the application. Alternatively, the first silicon material can be deposited using a physical vapor deposition process from a suitable silicon target. Deposition temperature can range from about 380 Degree Celsius to about 450 Degree Celsius, and preferably not higher than 440 Degree Celsius. In a specific embodiment, the p++ polysilicon material is deposited using a low pressure chemical vapor deposition process using disilane at a deposition temperature ranging from about 400 Degree Celsius to about 460 Degree Celsius.

Figure 5:
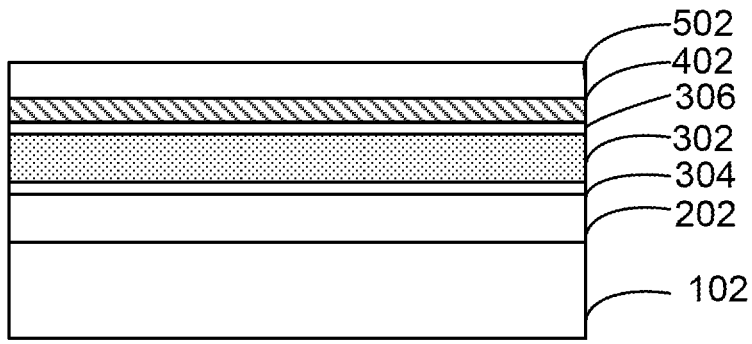
FIG. 5 is a simplified diagram illustrating a process step according to various embodiments of the present invention.

Referring to FIG. 5, the method deposits a resistive switching material 502 overlying junction material 402. Resistive switching material 502 can be a silicon material. The silicon material can be an amorphous silicon material or a polycrystalline silicon material, and others, depending on the embodiment. In a specific embodiment, resistive switching material 602 comprises an amorphous silicon material. The switching material is characterized by a state, for example, a resistance state dependent on an electric field in the switching material. In a specific embodiment, the switching material is an amorphous silicon material. Resistive switching material 502 has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies.

Deposition techniques can include a chemical vapor deposition process CVD), physical vapor deposition (PVD) process, an atomic layer deposition (ALD) process, and others. The chemical vapor process can be a low pressure chemical vapor deposition process, plasma enhanced chemical vapor deposition process, deposited using precursors such as silane, disilane, a suitable chlorosilane in a reducing environment, a combination, and others. Deposition temperature can range from 250 Degree Celsius to about 500 Degree Celsius. In some cases, deposition temperature ranges from about 400 Degree Celsius to about 440 Degree Celsius and no greater than about 450 Degree Celsius. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

In yet another embodiment, the resistive switching material/amorphous silicon material 502 may be formed from an upper region of the p+ polycrystalline silicon bearing layer using an Argon, Silicon, Oxygen plasma etch, or the like. For instance, a plasma etch may use a bias power within a range of approximately 30 watts to approximately 120 watts to convert an upper region of the polysilicon into a non-conductive amorphous silicon having p-type impurities (from the original polycrystalline silicon bearing layer).

Figure 6:
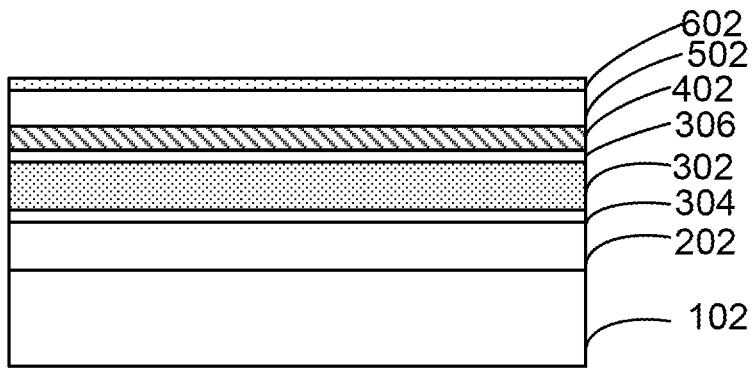
FIG. 6 is a simplified diagram illustrating a process step according to various embodiments of the present invention.

As shown in FIG. 6, in some embodiments, the method includes depositing an active conductive material 602 overlying resistive switching material 502. Active conductive material 602 can be a metal material such as copper, silver, gold, platinum, palladium, nickel, zinc, vanadium, or others. Active conductive material 602 is characterized by a suitable diffusivity in the resistive switching material in a presence of an electric field in a specific embodiment. For amorphous silicon material as the resistive switching material, the metal material can be silver or an alloy of silver. In some examples, the alloy of silver comprises at least 80 percent of silver.

In various embodiments, the silver material forms a silver region in a portion of the amorphous silicon material upon application of the electric filed. The silver region comprises a plurality of silver particles, including silver ions, silver clusters, silver atoms, or a combination thereof. The plurality of silver particles is formed in defect sites of the amorphous silicon material in a specific embodiment. The silver region further comprises a silver filament structure extending from the source of metal, e.g. silver/silver ions, towards the first wiring structure. The filament structure is characterized by a length, a distance between the silver particles, and a distance between the filament structure and the first electrode structure. In a specific embodiment, the resistive switching material (for example, the amorphous silicon material) is characterized by a resistance depending at least on a length, a distance between the silver particles, and a distance between the filament structure and the first electrode structure. Due to material mismatch, defect density is high at an interface region formed from the amorphous silicon material and the first wiring material, and may cause a short. The junction layer (for example, p+ polycrystalline silicon germanium material) controls an interfacial defect density for proper switching behavior of the resistive switching device in a specific embodiment.

In some embodiments, the silver material is in direct contact with the amorphous silicon used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide, nitride) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (e.g. oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

Figure 7:
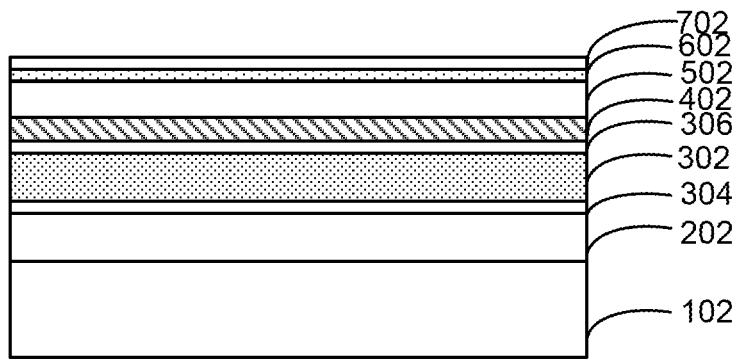
FIG. 7 is a simplified diagram illustrating a process step according to various embodiments of the present invention.

Referring to FIG. 7, the method includes forming a second diffusion barrier material 702 overlying active conductive material 602. For silver as active conductive material 702, second diffusion barrier material 702 may be a titanium, titanium nitride material, tungsten, or the like. Second diffusion barrier material 702 may be formed by a physical vapor deposition process using a titanium or tungsten target material. A nitride material may be formed using a physical vapor deposition process, or a chemical vapor process or an atomic layer deposition process or by a reaction of nitrogen with the titanium material.

In various embodiments, the second diffusion barrier material 702 is formed a short period of time after active conductive material 602 is formed. As examples, the short period of time may be less than 10 minutes, 20 minutes, 1 hour, or the like. In some examples, the short period of time is defined as less than or equal to about 1 day. By specifying a short period of time, atmospheric oxygen is inhibited from being absorbed into active conductive material 602 and/or transported to the resistive switching material 502, or interface between active conductive material 602 and resistive switching material 502, or the like.

In other embodiments, to reduce the amount of oxygen absorbed or contained within resistive switching material 502 or in active conductive material 602, the partially completed device is placed in an oxygen-reduced environment (e.g. substantially oxygen-free) a short time after active conductive material 602 is deposited. In some embodiments, the short period of time may be less than 15 minutes, 30 minutes, 2 hours, or the like. In some examples, the short period of time is defined as less than or equal to about 1 day. In various embodiments, the partially completed device is kept in the oxygen-reduced environment until the second diffusion barrier material 702 is deposited.

Figure 8:
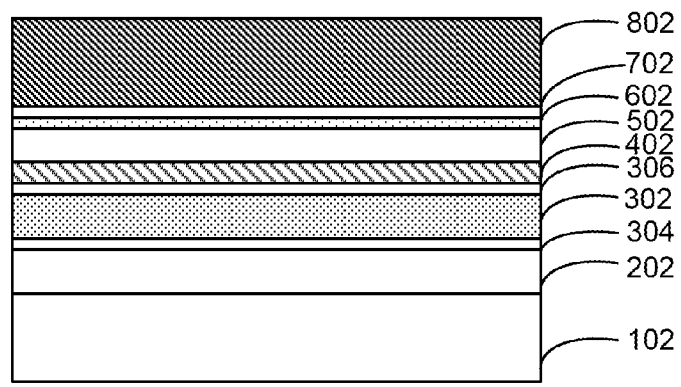
FIG. 8 is a simplified diagram illustrating a process step according to various embodiments of the present invention.

In a specific embodiment, the method includes forming a hard mask material 802 overlying second diffusion barrier material 702 as illustrated in FIG. 8. Hard mask material 802 can be a dielectric material, a metal material, a semiconductor material, or the like, depending on the application. In a specific embodiment, hard mask material can be a dielectric material such as silicon oxide, silicon nitride, a dielectric stack comprising alternating layers of silicon oxide and silicon nitride (for example, an ONO stack), a high K dielectric, a low K dielectric, and others.

Figure 9:
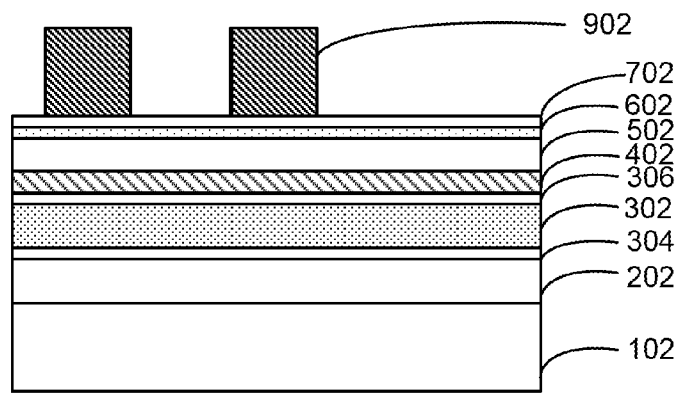
FIG. 9 is a simplified diagram illustrating a process step according to various embodiments of the present invention.

In various embodiments, hard mask material 802 is subjected to a first patterning and etching process to form a masking layer 902 as shown in FIG. 9. The first patterning and etching process may include depositing a photoresist material overlying the hard mask material, patterning the photoresist material, and etching the hard mask material using the patterned photoresist material. In other embodiments, other conventional forms of etching are contemplated.

Figure 10:
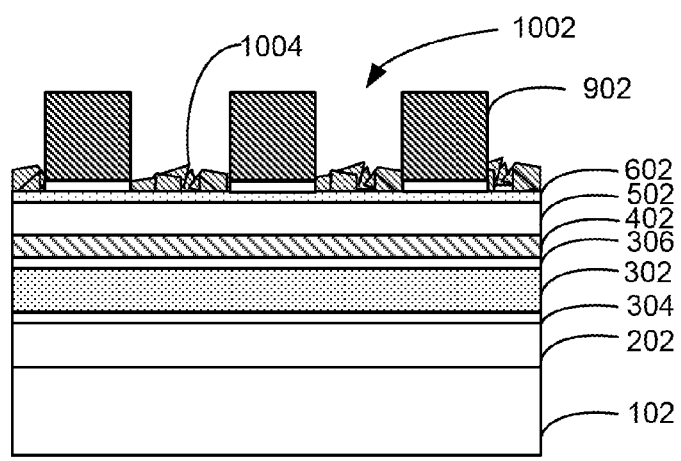
FIG. 10 is a simplified diagram illustrating a process step according to various embodiments of the present invention.

As shown in FIG. 10, the method includes subjecting second diffusion barrier material 702 to a second etching process using the masking layer 902 as a mask, exposing a surface region 1002 of active conductive material 602. For second diffusion barrier material 602 including titanium and/or titanium nitride, tungsten, or the like, the second etching process can use one or more chlorine (or fluorine) bearing species for etchants in certain embodiments. In some examples, the one or more chlorine bearing species can include chlorine gas or boron trichloride and a combination thereof.

In various embodiments, it was discovered that the chlorine bearing species sometimes form one or more chloride contaminant species 1004 with active conductive material 602. The one or more chloride contaminant species 1004 can adhere to a side wall region of the hard mask structure 902, on surface regions 1002 of active conductive material 602, and the like. These chloride contaminant species 1004 may form unintended circuit shorts thus degrading device performance and device yield.

In a specific embodiment, the method subjects the one or more contaminant chloride species 1004 to a solution comprising an ammonia species to remove, e.g. dissolve, the chloride contaminant species. In one example, taking silver as active conductive material 602 as an example, the one or more chlorine species used in the etchants form a silver chloride material 1004, which deposit on the hard mask structure 902 and the silver layer surface 1002. The silver chloride material 1004 is not typically a volatile compound and cannot be removed by a dry etching process. Additionally, the solubility of the silver chloride 1004 is low in water and thus cannot be removed by solubilizing (e.g. dissolving) only in water. Additionally, as the diffusion barrier material 902 overlies the active metal material 602, an acid is not used to remove silver chloride 1004, as acids may also react with active metal material 602, and render the device inoperable.

Figure 11:
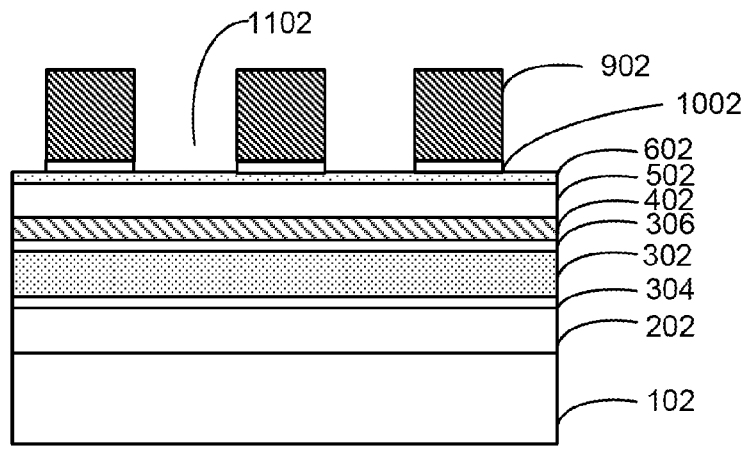
FIG. 11 is a simplified diagram illustrating a process step according to various embodiments of the present invention.

In a specific embodiment, the present method subjects the one or more chloride contaminant species 1004 to a cleaning process using an ammonia bearing species to solubilize the one or more chloride contaminant species 1004. The ammonia bearing species is configured to be free from any oxidizing species so as not to oxidize the underlying active metal material. In a specific embodiment, the ammonia bearing species can be ammonium hydroxide solution. The ammonium hydroxide solution can have a concentration characterized by a $H_2O$ to ammonium hydroxide ratio of about 4:1 to about 6.5:1. In another embodiment, the ammonium hydroxide solution can have a concentration characterized by a $H_2O$ to ammonium hydroxide ratio of about 4.5:1 to about 5:1. Other concentrations may also be used depending on the application. The cleaning process provides for at least a clean active conductive material surface region 1102 for a subsequent etching process as shown in FIG. 11.

Figure 12:
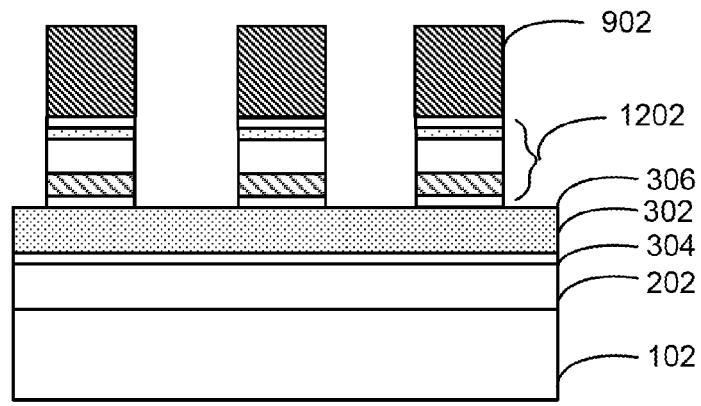
FIG. 12 is a simplified diagram illustrating a process step according to various embodiments of the present invention.

As shown in FIG. 12, the method subjects a stack of material comprising active conductive material 602, which now has a clean surface, resistive switching material 502, and junction material 402 to a third etching process to form a first structure 1202 using the hard mask including second diffusion barrier material 702 as a masking layer. In some embodiments, if the chloride contaminant material is allowed to remain on the surface region of the silver material, proper etching of the first structure is compromised. The first structure includes second diffusion barrier material 702, active conductive material 602, the resistive switching material 502, and junction material 402 as shown in FIG. 12.

Figure 13:
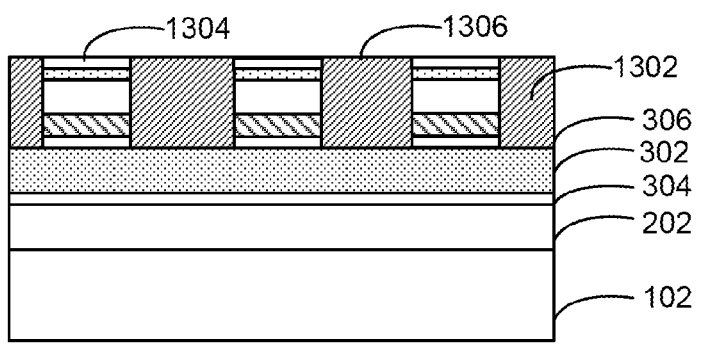
FIG. 13 is a simplified diagram illustrating a process step according to various embodiments of the present invention.

The method then removes the dielectric hard mask material remained after the third etching process, and forms a dielectric material 1302 overlying each of the first structures and filling gaps between the first gap structures as shown in FIG. 13. Dielectric material 1302 can be silicon oxide, silicon nitride, a dielectric stack comprising alternating layers of silicon oxide and silicon nitride (for example, an ONO stack), a high K dielectric, a low K dielectric, and others. Dielectric material 1302 can be deposited using techniques such as chemical vapor deposition process, including a low pressure chemical vapor deposition process, plasma enhanced chemical vapor deposition process, high density plasma chemical vapor deposition process, atomic layer deposition process, and others, depending on the application. Dielectric material 1302 can further be planarized to expose a surface region 1304 of the active conductive material to isolate each of the first structure and to form a planarized surface 1306, as shown in FIG. 13.

Figure 14:
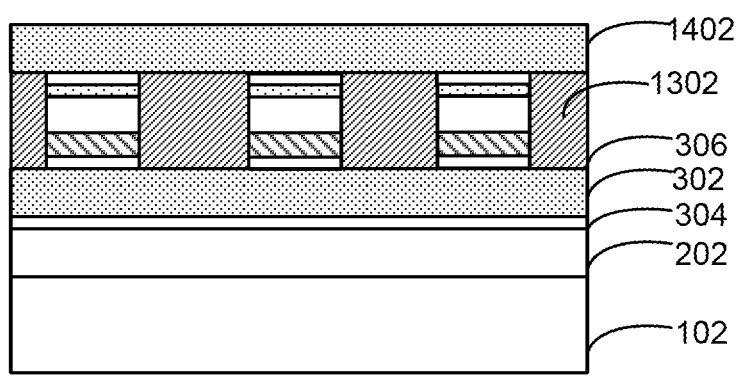
FIG. 14 is a simplified diagram illustrating a process step according to various embodiments of the present invention.

Referring to FIG. 14, a second wiring material 1402 is formed overlying the planarized surface of dielectric material 1302 and the active conductive material. Second wiring material 1402 can be a metal material such as copper, tungsten, aluminum, and others. Second wiring material 1402 can also be a suitably doped semiconductor material such as a doped polysilicon material and the likes, depending on the application.

Second wiring material 1402 is subjected to a fourth patterning and etching process to form one or more second wiring structures. The one or more second wiring structures are elongated in shape and configured to extend in a second direction orthogonal to the first direction of the first wiring structure. Moreover, at least the resistive switching element is configured in an intersecting region of the first wiring structure and the second wiring structure in a specific embodiment. The method can further include forming passivation layers and global interconnects for the memory device, among others to complete the device.

It is also understood that the examples and embodiments described herein are for illustrative purposes only and that various modifications or alternatives in light thereof will be suggested to persons skilled in the art and are to be included within the spirit and purview of this application and scope of the appended claims

What is claimed is:

1. A method for forming a silver structure for a non-volatile memory device, comprising:
   providing a silver layer material upon a underlying substrate;
   forming a diffusion barrier material overlying the silver layer material;
   forming a dielectric hard mask material overlying the diffusion barrier material;
   subjecting the dielectric hard mask material to a patterning and etching process to form a hard mask and to expose a portion of the diffusion barrier material;
   subjecting the portion of the diffusion barrier material to an etching process to remove the portion of the diffusion barrier material and to remove a portion of the silver layer material provided upon the underlying substrate using one or more chlorine bearing species as an etchant material, wherein one or more contaminant species is formed overlying adhered to at least a remaining portion of the silver layer material provided upon the underlying substrate, wherein the one or more contaminant species comprises chlorine bearing species and silver bearing species; and
   reacting the one or more contaminant species adhered to the remaining portion of the silver layer material provided upon the underlying substrate with a solution comprising an ammonia species to form a water soluble species, wherein the ammonia species is free from an oxidizing species to inhibit oxidation of the remaining portion of the silver layer material provided upon the underlying substrate.

2. The method of claim 1 further comprising:
   forming a first wiring material layer upon a dielectric layer;
   forming a junction material layer above the first wiring material layer; and
   forming a resistive switching material layer above the junction material layer; and
   wherein providing the silver layer material comprises providing the silver layer material above the resistive switching material layer.

3. The method of claim 2
   wherein the resistive switching material comprises a semiconductor material having intrinsic characteristics; and
   wherein the junction material comprises a doped silicon-containing material.

4. The method of claim 2 further comprising:
   etching a part of the remaining portion of silver layer material provided upon the underlying substrate, the resistive switching material layer, and the junction material layer to form the non-volatile memory device.

5. The method of claim 1 wherein the one or more chlorine bearing species comprises silver material from the portion of the silver layer material provided upon the underlying substrate.

6. The method of claim 1 wherein the diffusion barrier material is selected from a group consisting of: a titanium nitride material, a titanium containing material, a tantalum nitride material, a tungsten containing material, a titanium tungsten containing material.

7. The method of claim 1 wherein the dielectric hard mask material is selected from a group consisting of: a silicon oxide material, a silicon nitride material, a dielectric stack of alternating silicon oxide and silicon nitride materials.

8. The method of claim 1 wherein the one or more chlorine bearing species is selected from a group consisting of: boron trichloride and chlorine.

9. The method of claim 1 wherein the solution comprising the ammonia species comprises an ammonium hydroxide solution.

10. The method of claim 9 wherein the ammonium hydroxide solution is characterized by an ammonia to water ratio of about 1:3 to about 1:7.

11. A method of forming a non-volatile memory device, comprising:
    providing a substrate having a surface region;
    forming a first dielectric material overlying the surface region;
    forming a first wiring structure overlying the dielectric material;
    forming a junction material overlying the first wiring structure;
    forming a resistive switching material comprising an amorphous silicon material overlying the junction material;
    forming an active conductive material comprising a silver layer material overlying the resistive switching material;
    forming a diffusion barrier material overlying the active conductive material;
    forming a dielectric hard mask material overlying the diffusion barrier material;
    subjecting the dielectric hard mask material to a patterning and etching process to form a patterned dielectric hard mask and to expose a portion of the diffusion barrier material;
    removing the portion of the diffusion barrier material and a portion of the silver layer material overlying the junction material with an etching process using one or more chlorine bearing species as an etchant material to form a patterned diffusion barrier layer and to form one or more contaminant species overlying at least a remaining portion of the silver layer material overlying the junction material, wherein the one or more contaminant species comprises chlorine bearing species and silver bearing species;
    dissolving the one or more contaminant species with a solution comprising an ammonia species to expose a surface region of the remaining portion of the silver layer material substantially free from the one or more contaminant species, wherein the ammonia species is substantially free from an oxidizing species to inhibit oxidation of the remaining portion of the silver layer material; and forming a second wiring structure overlying at least the surface region of the remaining portion of the silver layer material substantially free from the one or more contaminant species.

12. The method of claim 11 further comprising:
etching the remaining portion of the silver layer material, the resistive switching material, and the junction material to thereby form the non-volatile memory structure.

13. The method of claim 12 wherein etching the remaining portion of the silver layer material uses the patterned dielectric hard mask a masking layer to form a pillar structure, wherein the first pillar structure comprises part of the remaining portion of the silver material, a portion of the resistive switching material, and a portion of the junction material.

14. The method of claim 11 wherein the junction material is selected from a group consisting of: p-doped polysilicon material, p-doped silicon-germanium material.

15. The method of claim 11 wherein forming the resistive switching material comprises subjecting a portion of the junction material subject to an amorphorizing process.

16. The method of claim 11 wherein the one or more chloride contaminant species comprises silver chloride.

17. The method of claim 11 wherein the one or more chlorine bearing species is selected from a group consisting of: boron trichloride and chlorine.

18. The method of claim 11 wherein the solution comprising the ammonia species comprises an ammonium hydroxide solution.

19. The method of claim 18 wherein the ammonium hydroxide solution is characterized by an ammonia to water ratio of about 1:3 to about 1:7.

20. The method of claim 11 wherein the diffusion barrier material is selected from a group consisting of: a titanium nitride material, a titanium containing material, a tantalum nitride material, a tungsten containing material, a titanium tungsten containing material.

* * * * *